(12) United States Patent
Li

(10) Patent No.: US 9,847,503 B2
(45) Date of Patent: *Dec. 19, 2017

(54) OLED BACKPLATE STRUCTURE

(71) Applicant: Shenzhen China Star Optoelectronics Technology Co., Ltd., Shenzhen (CN)

(72) Inventor: Wenhui Li, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/396,827

(22) Filed: Jan. 3, 2017

(65) Prior Publication Data
US 2017/0149012 A1 May 25, 2017

Related U.S. Application Data

(62) Division of application No. 14/771,203, filed on Aug. 28, 2015, now Pat. No. 9,601,558.

(30) Foreign Application Priority Data

May 6, 2015 (CN) .......................... 2015 1 0227787

(51) Int. Cl.
H01L 51/52 (2006.01)
H01L 27/32 (2006.01)

(52) U.S. Cl.
CPC ...... *H01L 51/5228* (2013.01); *H01L 27/3246* (2013.01); *H01L 27/3258* (2013.01); *H01L 2251/308* (2013.01)

(58) Field of Classification Search
CPC combination set(s) only.
See application file for complete search history.

(56) References Cited

U.S. PATENT DOCUMENTS

| 2008/0150419 | A1* | 6/2008 | Kang | H01L 51/524 313/504 |
| 2008/0180024 | A1* | 7/2008 | Kwon | H01L 27/3244 313/504 |
| 2011/0241562 | A1* | 10/2011 | Choi | H05B 33/0896 315/291 |
| 2015/0034913 | A1* | 2/2015 | Yoon | H01L 51/5203 257/40 |
| 2015/0255758 | A1* | 9/2015 | Hirai | H01L 51/5246 438/28 |
| 2016/0254455 | A1* | 9/2016 | Wang | H01L 51/56 438/23 |

* cited by examiner

Primary Examiner — Mamadou Diallo
(74) Attorney, Agent, or Firm — Leong C. Lei

(57) ABSTRACT

An OLED backplate structure is provided. Multiple auxiliary conducting layers contacting a cathode of the OLED are provided under the cathode in order to diminish the electrical resistance of the cathode to thereby enhance the conductivity of the cathode and to even the in plane voltages. The uniformity of the OLED display can be improved to prevent the uneven brightness issue and to decrease the thickness of the cathode for saving the production cost.

9 Claims, 3 Drawing Sheets

OLED BACKPLATE STRUCTURE

CROSS REFERENCE TO RELATED APPLICATIONS

This application is a divisional application of co-pending U.S. patent application Ser. No. 14/771,203, filed on Aug. 28, 2015.

BACKGROUND OF THE INVENTION

1. Field of the Invention

The present invention relates to a display technology field, and more particularly to an OLED backplate structure.

2. The Related Arts

An OLED is an Organic Light Emitting Diodes Display possessing properties of self-illumination, high brightness, wide view angle, high contrast, flexibility and low power consumption, etc., and accordingly has been received more attentions. As being the display of next generation, it has been gradually replaced traditional liquid crystal displays and widely applied in cellular phone screens, computer displays, full color TV, etc. OLED display technology is different from the traditional liquid crystal display technology and the back light is not required. It utilizes an ultra thin organic material coating layer and a glass substrate, and theses organic material will illuminate when the current is conducted.

Please refer to FIG. 1, which is a sectional diagram of an OLED backplate structure according to prior art, comprising a substrate 100, a TFT layer 700 positioned on the substrate 100, a first isolation layer 710 positioned on the TFT layer 700, a second isolation layer 720 positioned on the first isolation layer 710, a first electrode 810 positioned on the second isolation layer 720, a pixel definition layer 830 positioned on the first electrode 810 and the second isolation layer 720, a light emitting layer 900 positioned on the pixel definition layer 830 and the first electrode 810, a photospacer 840 positioned on the pixel definition layer 830, a second electrode 820 positioned on the pixel definition layer 830, the photospacer 840 and the light emitting layer 900.

The pixel definition layer 830 is provided with a first via 3110 correspondingly above the first electrode 810, and the first isolation layer 710 and the second isolation layer 720 are provided with a second via 3150 correspondingly above the TFT layer 700. The light emitting layer 900 contacts the first electrode 810 through the first via 3110, and the first electrode 810 contacts the TFT layer 700 through the second via 3150.

In the aforesaid OLED backplate structure, the first electrode 810 is employed as being a pixel electrode, which is an anode of the OLED, and the second electrode 820 is employed as being a cathode of the OLED, and the thickness of the second electrode 820 is thinner; particularly, in the top light emitting type OLED backplate structure, the transparent electrode has to be manufactured. Thus, a thinner second electrode 820 is required. However, under the circumstance that the second electrode 820 is thinner, the electrical resistance is larger, and particularly in the large scale display, the in plane voltages which is uneven can happen to influence the uniformity of the OLED display and cause issues of uneven brightness (mura).

SUMMARY OF THE INVENTION

An objective of the present invention is to provide an OLED backplate structure, of which the electrical resistance of the cathode is smaller and the conductivity is strong, and the in plane voltages are even. The uniformity of the OLED display can be improved, and the cathode is thinner, and the light transmission is better, and the production cost is low.

For realizing the aforesaid objective, the present invention provides an OLED backplate structure, comprising a substrate, a TFT layer positioned on the substrate, a first isolation layer positioned on the TFT layer, a second isolation layer positioned on the first isolation layer, a first electrode positioned on the second isolation layer, a pixel definition layer positioned on the first electrode and the second isolation layer, a light emitting layer positioned on the pixel definition layer and the first electrode, a photospacer positioned on the pixel definition layer, a second electrode positioned on the pixel definition layer, the photospacer and the light emitting layer;

multiple auxiliary conducting layers are provided to be apart with the first electrode under the second electrode, and the second electrode contacts the auxiliary conducting layers.

The pixel definition layer is provided with a first via correspondingly above the first electrode, and the first isolation layer and the second isolation layer are provided with a second via correspondingly above the TFT layer; the light emitting layer contacts the first electrode through the first via, and the first electrode contacts the TFT layer through the second via;

the first electrode is employed as being a pixel electrode, which is an anode of the OLED, and the second electrode is employed as being a cathode of the OLED.

An auxiliary conducting layer is provided on the second isolation layer, and the pixel definition layer is provided with a third via correspondingly above the auxiliary conducting layer, and the second electrode contacts the auxiliary conducting layer through the third via.

The auxiliary conducting layer and the first electrode are manufactured by employing the same mask.

An auxiliary conducting layer is provided on the first isolation layer, and the pixel definition layer and the second isolation layer are provided with a third via correspondingly above the auxiliary conducting layer, and the second electrode contacts the auxiliary conducting layer through the third via.

The auxiliary conducting layer is manufactured alone or manufactured with other conductive electrodes at the same time.

The first isolation layer is provided with a first auxiliary conducting layer, and the second isolation layer is provided with a second auxiliary conducting layer, and the pixel definition layer is provided with a third via correspondingly above the second auxiliary conducting layer, and the second isolation layer is provided with a fourth via correspondingly above the first auxiliary conducting layer; the second auxiliary conducting layer contacts the first auxiliary conducting layer through the fourth via, and the second electrode contacts the second auxiliary conducting layer through the third via.

Material of the auxiliary conducting layers is ITO.

The auxiliary conducting layers are distributed to appear to be a continuous latticework, or constituted by multiple auxiliary conducting blocks arranged in spaces.

Arrangements of the respective multiple auxiliary conducting layers are the same or different.

The present invention further provides an OLED backplate structure, comprising a substrate, a TFT layer positioned on the substrate, a first isolation layer positioned on the TFT layer, a second isolation layer positioned on the first isolation layer, a first electrode positioned on the second isolation layer, a pixel definition layer positioned on the first electrode and the second isolation layer, a light emitting layer positioned on the pixel definition layer and the first electrode, a photospacer positioned on the pixel definition layer, a second electrode positioned on the pixel definition layer, the photospacer and the light emitting layer;

multiple auxiliary conducting layers are provided to be apart with the first electrode under the second electrode, and the second electrode contacts the auxiliary conducting layers;

wherein the pixel definition layer is provided with a first via correspondingly above the first electrode, and the first isolation layer and the second isolation layer are provided with a second via correspondingly above the TFT layer; the light emitting layer contacts the first electrode through the first via, and the first electrode contacts the TFT layer through the second via;

the first electrode is employed as being a pixel electrode, which is an anode of the OLED, and the second electrode is employed as being a cathode of the OLED;

wherein an auxiliary conducting layer is provided on the second isolation layer, and the pixel definition layer is provided with a third via correspondingly above the auxiliary conducting layer, and the second electrode contacts the auxiliary conducting layer through the third via;

wherein the auxiliary conducting layer and the first electrode are manufactured by employing the same mask.

The benefits of the present invention are: in the OLED backplate of the present invention, multiple auxiliary conducting layers contacting the cathode are provided under the cathode of the OLED, which can diminish the electrical resistance of the cathode to enhance the conductivity of the cathode and to even the in plane voltages. The uniformity of the OLED display can be improved to prevent the uneven brightness issue and to decrease the thickness of the cathode for saving the production cost.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In the drawing.

DETAILED DESCRIPTION OF THE PREFERRED EMBODIMENTS

For better explaining the technical solution and the effect of the present invention, the present invention will be further described in detail with the accompanying drawings and the specific embodiments.

Figure 1:
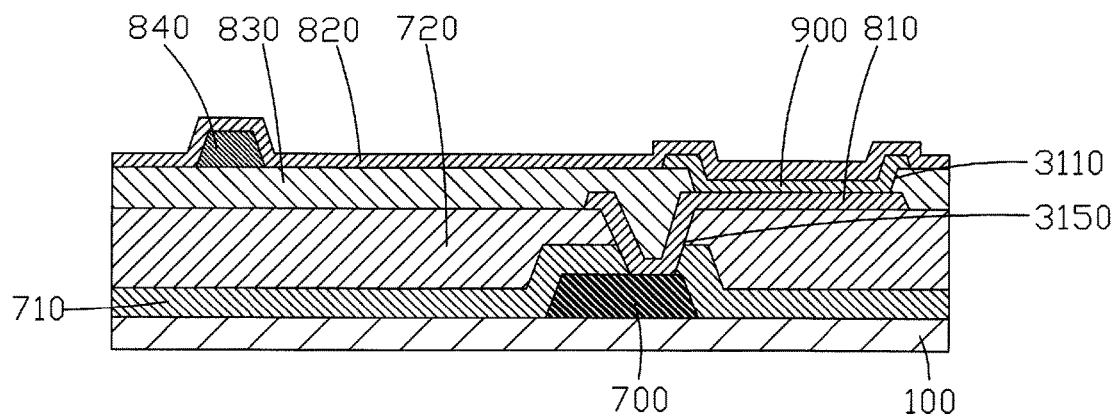
FIG. 1 is a sectional diagram of an OLED backplate structure according to prior art.
Figure 2:
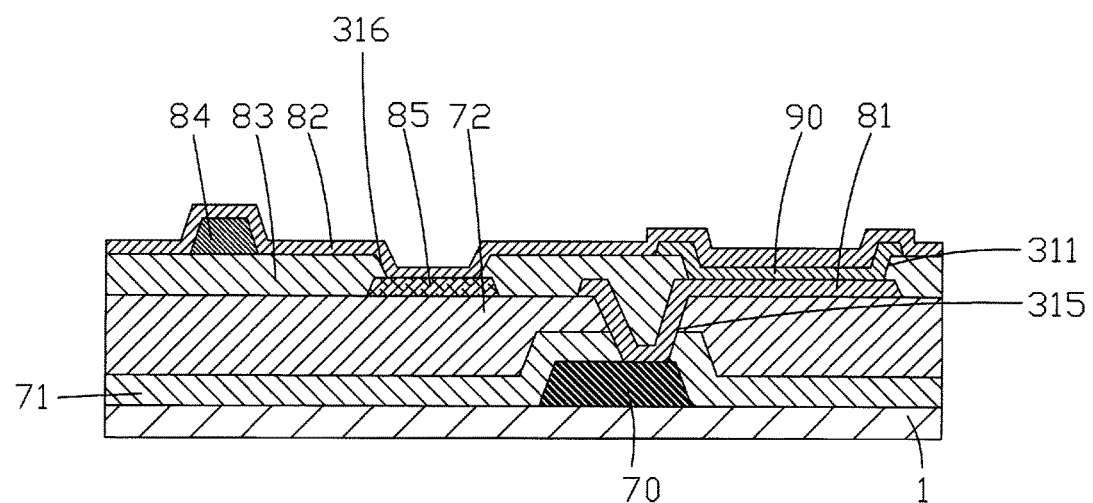
FIG. 2 is a sectional diagram of an OLED backplate structure according to the first embodiment of the present invention.
Figure 3:
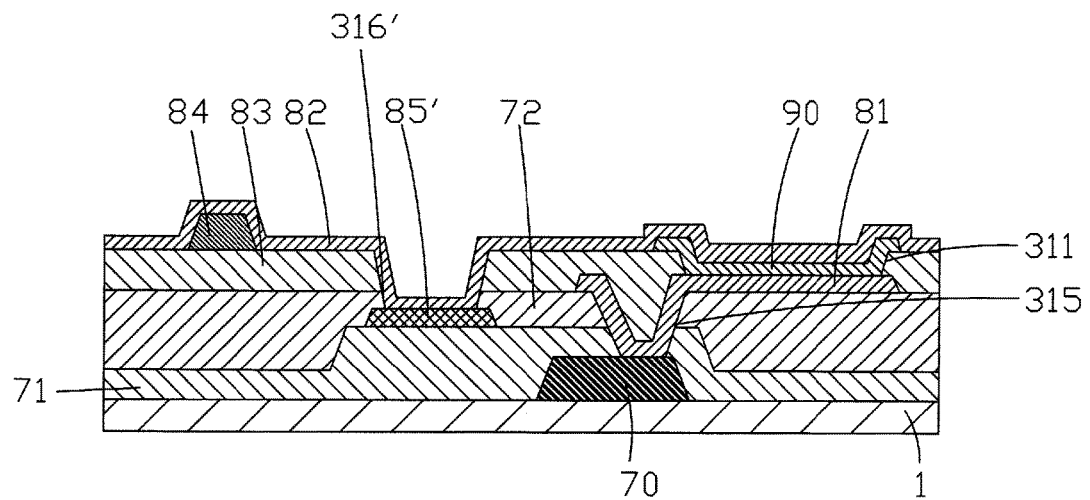
FIG. 3 is a sectional diagram of an OLED backplate structure according to the second embodiment of the present invention.
Figure 4:
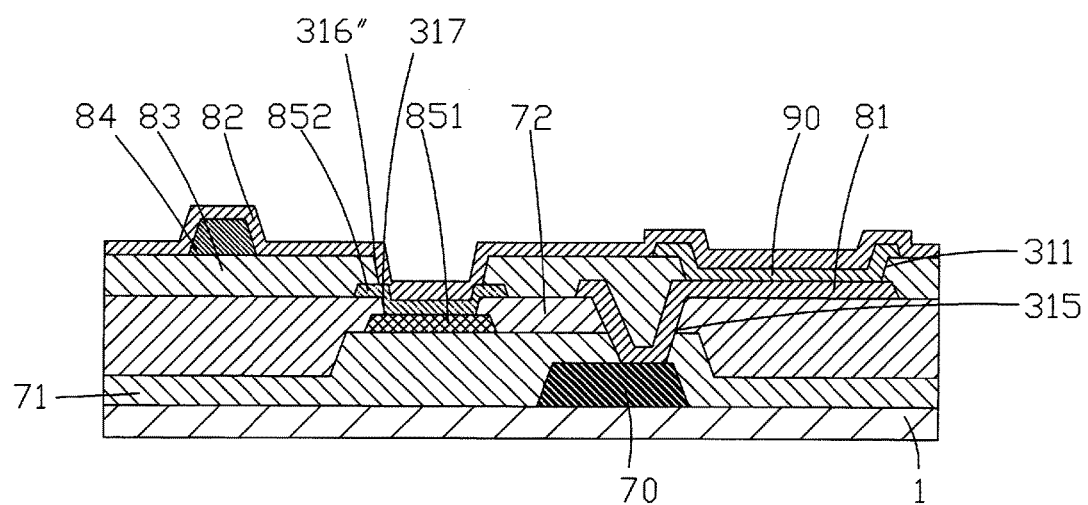
FIG. 4 is a sectional diagram of an OLED backplate structure according to the third embodiment of the present invention.

Please refer from FIG. 2 to FIG. 4. The present invention provides an OLED backplate structure, comprising a substrate 1, a TFT layer 70 positioned on the substrate 1, a first isolation layer 71 positioned on the TFT layer, a second isolation layer 72 positioned on the first isolation layer 71, a first electrode 81 positioned on the second isolation layer 72, a pixel definition layer 83 positioned on the first electrode 81 and the second isolation layer 72, a light emitting layer 90 positioned on the pixel definition layer 83 and the first electrode 81, a photospacer 84 positioned on the pixel definition layer 83, a second electrode 82 positioned on the pixel definition layer 83, the photospacer 84 and the light emitting layer 90.

Multiple auxiliary conducting layers are provided to be apart with the first electrode 81 under the second electrode 82, and the second electrode 82 contacts the auxiliary conducting layers.

Specifically, the pixel definition layer 83 is provided with a first via 311 correspondingly above the first electrode 81, and the first isolation layer 71 and the second isolation layer 72 are provided with a second via 315 correspondingly above the TFT layer 70.

The light emitting layer 90 contacts the first electrode 81 through the first via 311, and the first electrode 81 contacts the TFT layer 70 through the second via 315.

The first electrode 81 is employed as being a pixel electrode, which is an anode of the OLED, and the second electrode 82 is employed as being a cathode of the OLED.

Specifically, material of the first electrode 81 is ITO (Indium Tin Oxide).

Please refer to FIG. 2, which is a sectional diagram of an OLED backplate structure according to the first embodiment of the present invention. An auxiliary conducting layer 85 is provided on the second isolation layer 72, and the pixel definition layer 83 is provided with a third via 316 correspondingly above the auxiliary conducting layer 85, and the second electrode 82 contacts the auxiliary conducting layer 85 through the third via 316.

Specifically, the auxiliary conducting layer 85 and the first electrode 81 can be manufactured by employing the same mask.

Specifically, material of the auxiliary conducting layer 85 can be ITO or other conductive materials.

Please refer to FIG. 3, which is a sectional diagram of an OLED backplate structure according to the second embodiment of the present invention. An auxiliary conducting layer 85' is provided on the first isolation layer 71, and the pixel definition layer 83 and the second isolation layer 72 are provided with a third via 316' correspondingly above the auxiliary conducting layer 85', and the second electrode 82 contacts the auxiliary conducting layer 85' through the third via 316'.

Specifically, the auxiliary conducting layer 85' can be manufactured alone or manufactured with other conductive electrodes, such as the source/the drain of the TFT layer 70 at the same time.

Specifically, material of the auxiliary conducting layer 85' can be ITO or other conductive materials.

Please refer to FIG. 4, which is a sectional diagram of an OLED backplate structure according to the third embodiment of the present invention. The first isolation layer 71 is provided with a first auxiliary conducting layer 851, and the second isolation layer 72 is provided with a second auxiliary conducting layer 852, and the pixel definition layer 83 is provided with a third via 316" correspondingly above the second auxiliary conducting layer 852, and the second isolation layer 72 is provided with a fourth via 317 correspondingly above the first auxiliary conducting layer 851; the second auxiliary conducting layer 852 contacts the first auxiliary conducting layer 851 through the fourth via 317, and the second electrode 82 contacts the second auxiliary conducting layer 852 through the third via 316".

Specifically, material of the first auxiliary conducting layer 851 and the second auxiliary conducting layer 852 can be ITO or other conductive materials.

Figure 5:
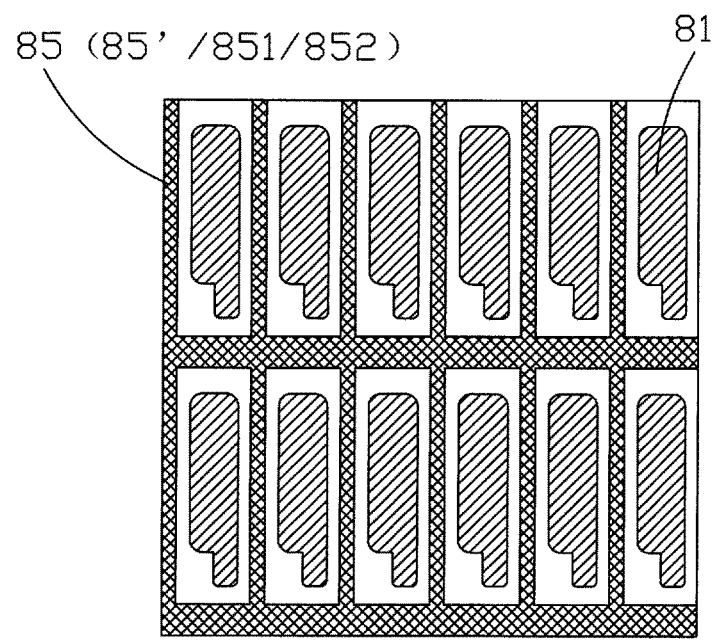
FIG. 5 is a top view diagram of one distribution way of the auxiliary conducting layers according to the OLED backplate structure of the present invention.
Figure 6:
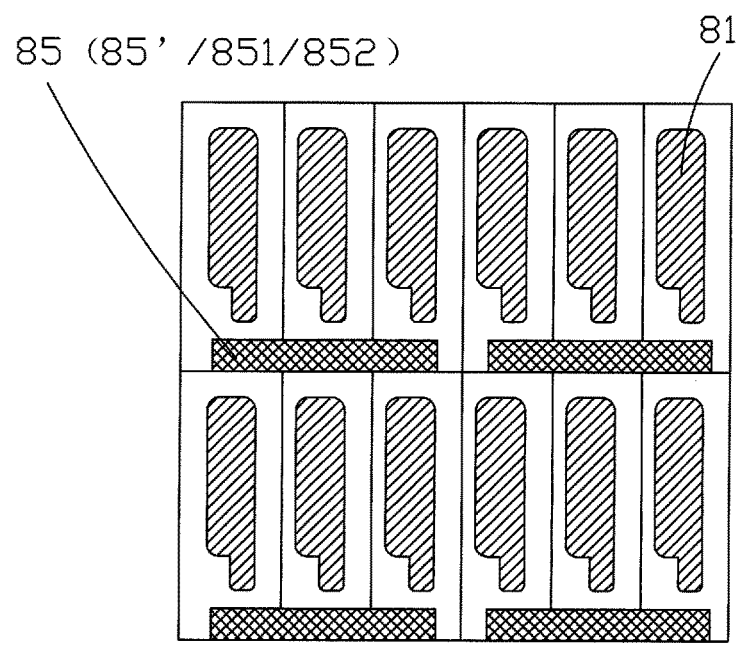
FIG. 6 is a top view diagram of another distribution way of the auxiliary conducting layers according to the OLED backplate structure of the present invention.

Significantly, in the aforesaid first to third embodiments, the auxiliary conducting layers can be continuously distributed as shown in FIG. 5, being distributed to appear to be a continuous latticework or continuously distributed to be other appearances; the auxiliary conducting layers can be non-continuously distributed as shown in FIG. 6, being constituted by multiple auxiliary conducting blocks arranged in spaces. In the aforesaid third embodiment, arrangements of the respective multiple auxiliary conducting layers can be the same or can be different.

In conclusion, in the OLED backplate of the present invention, multiple auxiliary conducting layers contacting the cathode are provided under the cathode of the OLED, which can diminish the electrical resistance of the cathode to enhance the conductivity of the cathode and to even the in plane voltages. The uniformity of the OLED display can be improved to prevent the uneven brightness issue and to decrease the thickness of the cathode for saving the production cost.

The above are only specific embodiments of the present invention, the scope of the present invention is not limited to this, and to any persons who are skilled in the art, change or replacement that is easily derived should be covered by the protected scope of the invention. Thus, the protected scope of the invention should go by the subject claims.

What is claimed is:

1. An organic light emitting diode (OLED) backplate structure, comprising a substrate, a thin-film transistor (TFT) layer positioned on the substrate, a first isolation layer positioned on the TFT layer, a second isolation layer positioned on the first isolation layer, a first electrode positioned on the second isolation layer, a pixel definition layer positioned on the first electrode and the second isolation layer, a light emitting layer positioned on the pixel definition layer and the first electrode, a photospacer positioned on the pixel definition layer, and a second electrode positioned on the pixel definition layer, the photospacer and the light emitting layer;

wherein multiple auxiliary conducting layers are provided to be apart from the first electrode under the second electrode, and the second electrode contacts the auxiliary conducting layers; and wherein an auxiliary conducting layer is provided on the first isolation layer, and the pixel definition layer and the second isolation layer are provided with a third via correspondingly above the auxiliary conducting layer, and the second electrode contacts the auxiliary conducting layer through the third via.

2. The OLED backplate structure according to claim 1, wherein the pixel definition layer is provided with a first via correspondingly above the first electrode, and the first isolation layer and the second isolation layer are provided with a second via correspondingly above the TFT layer; the light emitting layer contacts the first electrode through the first via, and the first electrode contacts the TFT layer through the second via;

wherein the first electrode is a pixel electrode, which is an anode of the OLED, and the second electrode is a cathode of the OLED.

3. The OLED backplate structure according to claim 1, wherein the auxiliary conducting layer is manufactured alone or manufactured with other conductive electrodes at the same time.

4. The OLED backplate structure according to claim 1, wherein a material of the auxiliary conducting layers is indium tin oxide (ITO).

5. The OLED backplate structure according to claim 1, wherein the auxiliary conducting layers are distributed to appear to be a continuous latticework, or constituted by multiple auxiliary conducting blocks arranged in spaces.

6. The OLED backplate structure according to claim 1, wherein arrangements of the respective multiple auxiliary conducting layers are the same or different.

7. An organic light emitting diode (OLED) backplate structure, comprising a substrate, a thin-film transistor (TFT) layer positioned on the substrate, a first isolation layer positioned on the TFT layer, a second isolation layer positioned on the first isolation layer, a first electrode positioned on the second isolation layer, a pixel definition layer positioned on the first electrode and the second isolation layer, a light emitting layer positioned on the pixel definition layer and the first electrode, a photospacer positioned on the pixel definition layer, a second electrode positioned on the pixel definition layer, the photospacer and the light emitting layer;

wherein multiple auxiliary conducting layers are provided to be apart from the first electrode under the second electrode, and the second electrode contacts the auxiliary conducting layers;

wherein the pixel definition layer is provided with a first via correspondingly above the first electrode, and the first isolation layer and the second isolation layer are provided with a second via correspondingly above the TFT layer; the light emitting layer contacts the first electrode through the first via, and the first electrode contacts the TFT layer through the second via;

wherein the first electrode is a pixel electrode, which is an anode of the OLED, and the second electrode is a cathode of the OLED; and wherein an auxiliary conducting layer is provided on the first isolation layer, and the pixel definition layer and the second isolation layer are provided with a third via correspondingly above the auxiliary conducting layer, and the second electrode contacts the auxiliary conducting layer through the third via.

8. The OLED backplate structure according to claim 7, wherein a material of the auxiliary conducting layers is indium tin oxide (ITO).

9. The OLED backplate structure according to claim 7, wherein the auxiliary conducting layers are distributed to appear to be a continuous latticework, or constituted by multiple auxiliary conducting blocks arranged in spaces.

* * * * *